United States Patent [19]

Naarmann et al.

[11] 4,340,507

[45] Jul. 20, 1982

[54] PREPARATION OF ELECTRICALLY CONDUCTIVE POLYAROMATICS, AND THEIR USE IN THE ELECTRICAL INDUSTRY AND FOR RENDERING PLASTICS ANTISTATIC

[75] Inventors: Herbert Naarmann, Wattenheim; Dieter Naegele, Worms; Klaus Penzien, Frankenthal; Johannes Schlag, Ludwigshafen, all of Fed. Rep. of Germany

[73] Assignee: BASF Aktiengesellschaft, Fed. Rep. of Germany

[21] Appl. No.: 204,639

[22] Filed: Nov. 6, 1980

[30] Foreign Application Priority Data

Dec. 1, 1979 [DE] Fed. Rep. of Germany ....... 2948454

[51] Int. Cl.$^3$ ............................................. H01B 1/02
[52] U.S. Cl. ................................ 252/512; 252/500
[58] Field of Search .............................. 252/500, 512; 260/DIG. 21; 526/4; 357/8, 15

[56] References Cited

U.S. PATENT DOCUMENTS

| | | | |
|---|---|---|---|
| 4,204,216 | 9/1980 | Heeger et al. | 252/500 |
| 4,222,903 | 9/1980 | Heeger et al. | 252/518 |
| 4,269,738 | 5/1981 | Pez | 252/500 |

*Primary Examiner*—Joseph L. Schofer
*Assistant Examiner*—J. L. Barr
*Attorney, Agent, or Firm*—Keil & Witherspoon

[57] ABSTRACT

A process for the preparation of electrically conductive polyaromatics having conductivities greater than $10^{-2}$ S/cm., wherein from 0.5 to 5% by weight, based on the polyaromatics, of sodium, potassium, rubidium, cesium or their amides, preferably in tetrahydrofuran, dimethoxyglycol, anthracene, naphthalene or 2-methylstyrene, are incorporated into polyaromatics, in the absence of moisture and of oxygen. The conductive polyaromatics obtained may be used in the electrical industry for the manufacture of solar cells, for the conversion of radiation and for the manufacture of electrical and magnetic switches, and may also be used to render plastics antistatic.

3 Claims, No Drawings

PREPARATION OF ELECTRICALLY CONDUCTIVE POLYAROMATICS, AND THEIR USE IN THE ELECTRICAL INDUSTRY AND FOR RENDERING PLASTICS ANTISTATIC

The present invention relates to a process for the preparation of electrically conductive polyaromatics having electrical conductivities greater than $10^{-2}$ S/cm, and their use in the electrical industry and for rendering plastics antistatic.

The preparation of polyaromatics by oxidative coupling has been disclosed, cf. "Macromolecular Syntheses Collective", published by John Wiley & Sons, 1 (1979), 109–110. The preparation of polyaromatics by stepwise polycondensation has also been disclosed, cf. R. Gehm and W. Kern, Makromolekulare Chemie, 7 (1951), 46–61, and this process gives particularly pure methyl-substituted derivatives, linked in the para-position to form a chain, and free from contamination by ortho-linked or meta-linked polymers.

It is an object of the present invention to convert the conventional polyaromatics, by means of additives, into electrically conductive polymers having electrical conductivities greater than $10^{-2}$ S/cm.

We have found that this object is achieved, according to the invention, if from 0.5 to 5% by weight, based on the polyaromatics employed, of sodium, potassium, rubidium, cesium or their amides are added to the polyaromatics, in the absence of moisture and of oxygen. In a preferred embodiment, Na, K, Rb, Cs or their amides, in tetrahydrofuran, dimethoxyglycol, anthracene, naphthalene or 2-methylstyrene, are added, in each case in a molar ratio of alkali metal or amide to organic fluid of from 1:1 to 1:50, preferably from 1:2 to 1:3.

For the purposes of the invention, polyaromatics are the conventional relatively high molecular weight products whose chains consist completely of aromatic systems, which may or may not contain substituents R, coupled to one another, as shown by the general formula:

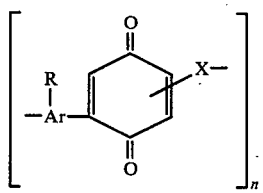

and which are obtained by a Friedel Crafts reaction under dehydrogenating conditions, or by other methods of dehydrogenation or oxidative coupling, from benzene, or substituted benzenes and benzoquinone or derivatives thereof. Polyaromatics in which the aromatic systems are linked linearly are preferred. The polyaromatics have a molecular weight of from 200 to 5,000, ie. n is from 1 to 50. In the above formula, X is Ar—R, Ar is an aromatic system, preferably phenylene, and R is H or an aliphatic, cycloaliphatic or aromatic group, or a functional group, eg.

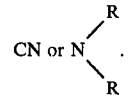

The electrical conductivities are measured, in S/cm at 30° C., by the method of F. Beck, "Berichte Bunsengesellschaft, Physikalische Chemie" 68 (1964), 558–567. The electrical conductivities of the novel conductive polyaromatics are greater than $10^{-2}$ S/cm. The polyaromatics can be prepared by the methods in the literature cited at the outset or by the method of P. R. Schildneck et al., J. Amer. Chem. Soc. 53 (1931), 2373.

According to the process of the invention, from 0.5 to 5% by weight, based on the polyaromatic employed, of sodium, potassium, rubidium, cesium or their amides are added to the polyaromatics.

The additives are incorporated in the absence of moisture (water) and of oxygen (air), preferably under an argon atmosphere. It is preferred to employ an auxiliary fluid, such as tetrahydrofuran, dimethoxyglycol, anthracene, naphthalene or α-methylstyrene, in each case in a molar ratio of alkali metal or amide to organic fluid of 1:1 to 1:50, which is stripped off under reduced pressure, below 30° C., after the additive has been incorporated. Preferably, the above molar ratio is from 1:2 to 1:3.

The electrical conductivity can be increased by several orders of magnitude by using the above additives. The polyaromatics prepared by stepwise condensation have initial conductivities of less than $10^{-12}$ S/cm, but after incorporation of the additives according to the invention acquire conductivities of not less than $10^{-2}$ S/cm.

The electrically conductive polyaromatics, prepared according to the invention and having electrical conductivities of not less than $10^{-2}$ S/cm, may be used for rendering plastics antistatic, for the production of solar cells, for the conversion of radiation, and for the production of electrical and magnetic switches. The addition of the strong Lewis bases to the polyaromatic results in an n-conductor.

In the Examples which follow, parts are by weight. The number of chain members n (ie. the chain length of the polyaromatics), is deduced by end group analysis, namely infrared determination of the ratio of the monofunctional end group to the difunctional middle groups.

EXAMPLES 1 to 7

The additive is introduced into 10 parts of a polyaromatic under an argon atmosphere, in the absence of moisture. The electrical conductivity is measured by the method of F. Beck, "Ber. Bunsengesellschaft, Phys. Chem." 68 (1964) 558–567.

| No. | Polyaromatic, type and amount | [formula] $_n$ | Doping Agent Type | Amount | Conductivity, S/cm at 30° C. Before doping | After doping |
|---|---|---|---|---|---|---|
| 1 | 10 parts, n about 3 | (2) | Na | 0.2 | $10^{-5}$ | $4.1 \times 10^{-2}$ |
| 2 | 10 parts, n about 5 | (2) | Na | 0.5 | $10^{-5}$ | $6.3 \times 10^{-2}$ |
| 3 | 10 parts, n about 10 | (2) | Na | 1.0 | $10^{-5}$ | $0.8 \times 10^{-1}$ |
| 4 | 10 parts, n about 15 | (2) | Na | 0.2 | $10^{-6}$ | $2.7 \times 10^{-1}$ |
| 5 | 10 parts, n about 10 | | in Na | 2.0 | $10^{-6}$ | $1.6 \times 10^{+2}$ |
| 6 | +10 parts, n about 10 | (2) | Na | 0.2 | $10^{-6}$ | $3.8 \times 10^{-2}$ |
| 7 | ++10 parts, n about 20 | (2) | K | 0.2 | $10^{-6}$ | $3.9 \times 10^{-2}$ |
| Comparison | 10 parts, n = about 3 (polyphenylene) | (1) | Na | 0.2 | $10^{-12}$ | $1.8 \times 10^{-8}$ |
| 8 | 10 parts, n = 1 | (2a) | Na | 1.0 | $10^{-5}$ | $2.3 \times 10^{-2}$ |

(1) Obtained by the method of R. Gehm et al., Makromol. Chem. 7 (1951), 46–61.
(2) Obtained by method (2a), described in J. Amer. Chem. Soc. 53 (1931), 2373, followed by oxidative coupling as described in Macromol. Synthesis, Collective Vol. 1 (1979), 109–110.

In Examples 1 to 8, $X = -Ar-$ with R substituent,

In Examples 1 to 5 and 8, $-Ar-$ = phenylene (benzene ring)

In Example 6, $-Ar-$ = biphenylene

In Example 7, $-Ar-$ = anthracene

We claim:

1. A process for the preparation of an electrically conductive polyaromatic of the formula $$\left[ \begin{array}{c} R \\ -Ar- \end{array} \underset{O}{\overset{O}{\bigcirc}} X- \right]_n$$

wherein Ar is phenylene, R is H, X is phenylene and n is a whole number of from 1 to 50, said polyaromatic having an electrical conductivity greater than $10^{-2}$ S/cm, wherein from 0.5 to 5% by weight, based on the polyaromatic employed, of sodium, potassium, rubidium or cesium are added to the polyaromatic, in the absence of moisture and of oxygen.

2. The process of claim 1, wherein Na, K, Rb or Cs are added in tetrahydrofuran, dimethoxyglycol, anthracene, naphthalene or 2-methylstyrene, in each case in a molar ratio of additive to organic fluid of from 1:1 to 1:50.

3. The process of claim 2, wherein the molar ratio of additive to organic fluid is from 1:2 to 1:3.

* * * * *